United States Patent [19]

Alappat et al.

[11] Patent Number: 5,440,676

[45] Date of Patent: Aug. 8, 1995

[54] RASTER SCAN WAVEFORM DISPLAY RASTERIZER WITH PIXEL INTENSITY GRADATION

[75] Inventors: Kuriappan P. Alappat; Edward E. Ayerill, both of Beaverton; James G. Larsen, Tigard, all of Oreg.

[73] Assignee: Tektronix, Inc., Wilsonville, Oreg.

[21] Appl. No.: 149,792

[22] Filed: Jan. 29, 1988

[51] Int. Cl.[6] ............................................. G06T 1/00
[52] U.S. Cl. ...................................... 395/143; 345/136
[58] Field of Search .................................. 364/518–522; 324/121 R; 340/721; 395/142, 143, 132, 131, 133, 134; 345/11–14, 134, 136

[56] References Cited

U.S. PATENT DOCUMENTS

| | | | |
|---|---|---|---|
| 4,215,414 | 7/1980 | Huelsman | 340/728 |
| 4,540,938 | 9/1985 | Bruce | 324/121 R |
| 4,586,037 | 4/1986 | Rosener | 340/728 |
| 4,634,970 | 1/1987 | Payne et al. | 324/121 R |
| 4,672,369 | 1/1987 | Preiss et al. | 340/728 |
| 4,743,844 | 5/1988 | Odenheimer et al. | 324/121 R |
| 4,760,331 | 7/1988 | Komuro et al. | 324/121 R |
| 4,764,721 | 8/1988 | Slavin | 344/121 R |

*Primary Examiner*—Heather R. Herndon
*Attorney, Agent, or Firm*—Francis I. Gray; Peter J. Meza; Alexander C. Johnson, Jr.

[57] ABSTRACT

An analog input signal to a digital oscilloscope is sampled and digitized to form a representative waveform data sequence. A waveform is then displayed on a screen of the oscilloscope to represent the magnitude of the waveform as a function of time as indicated by the waveform data sequence. The waveform is formed by a set of vectors, each vector comprising a straight line between two points on the screen at elevations representing magnitudes of two successive input signal samples, and at horizontal positions representing timing of the two samples. The screen provides a display organized into an array of pixels, each of which may be illuminated with variable intensity, and each vector is represented by illuminating pixels having center points bounding the trajectory of the vector on the screen. The intensity of each such illuminated pixel is modulated in accordance with the distance between the pixel and the vector trajectory.

5 Claims, 4 Drawing Sheets

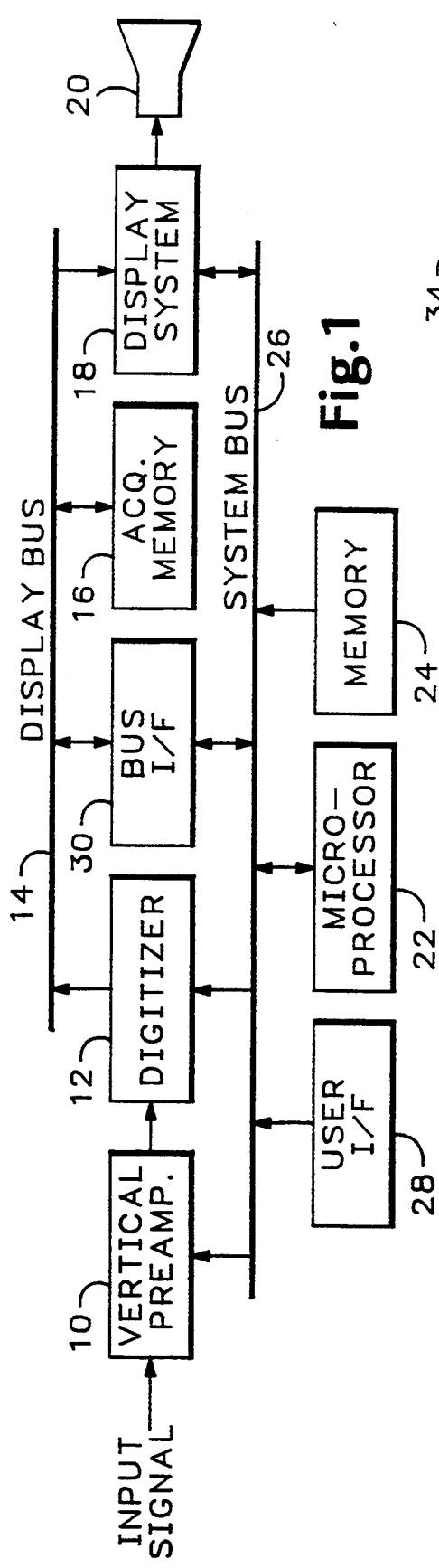
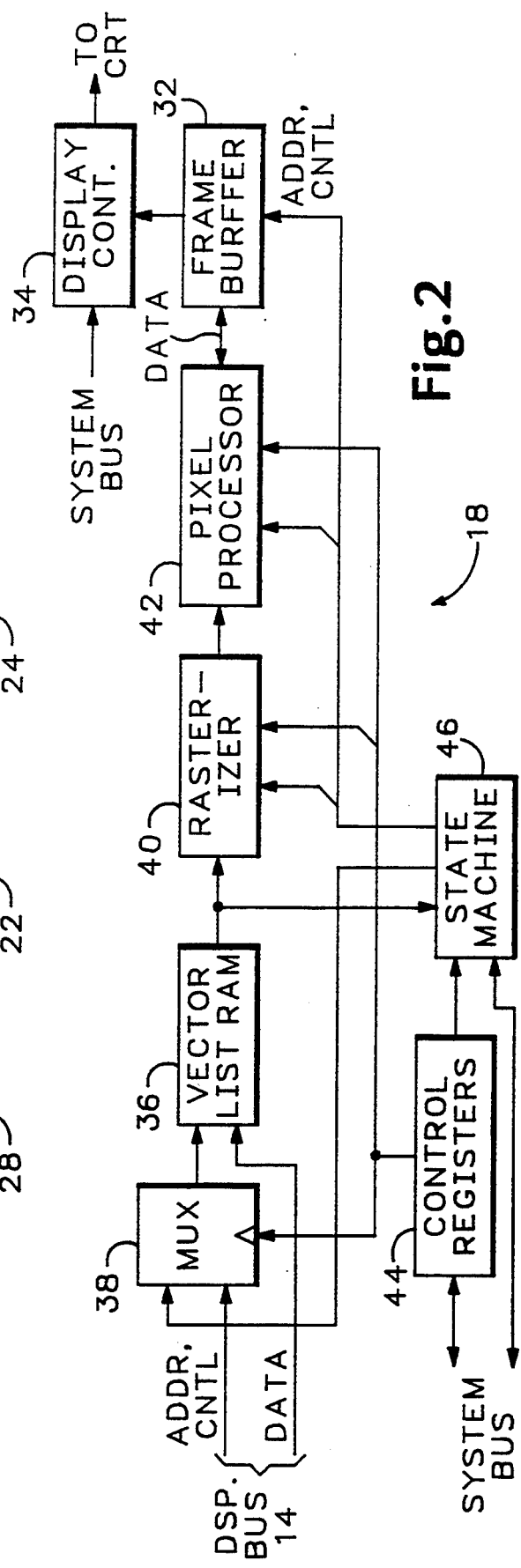

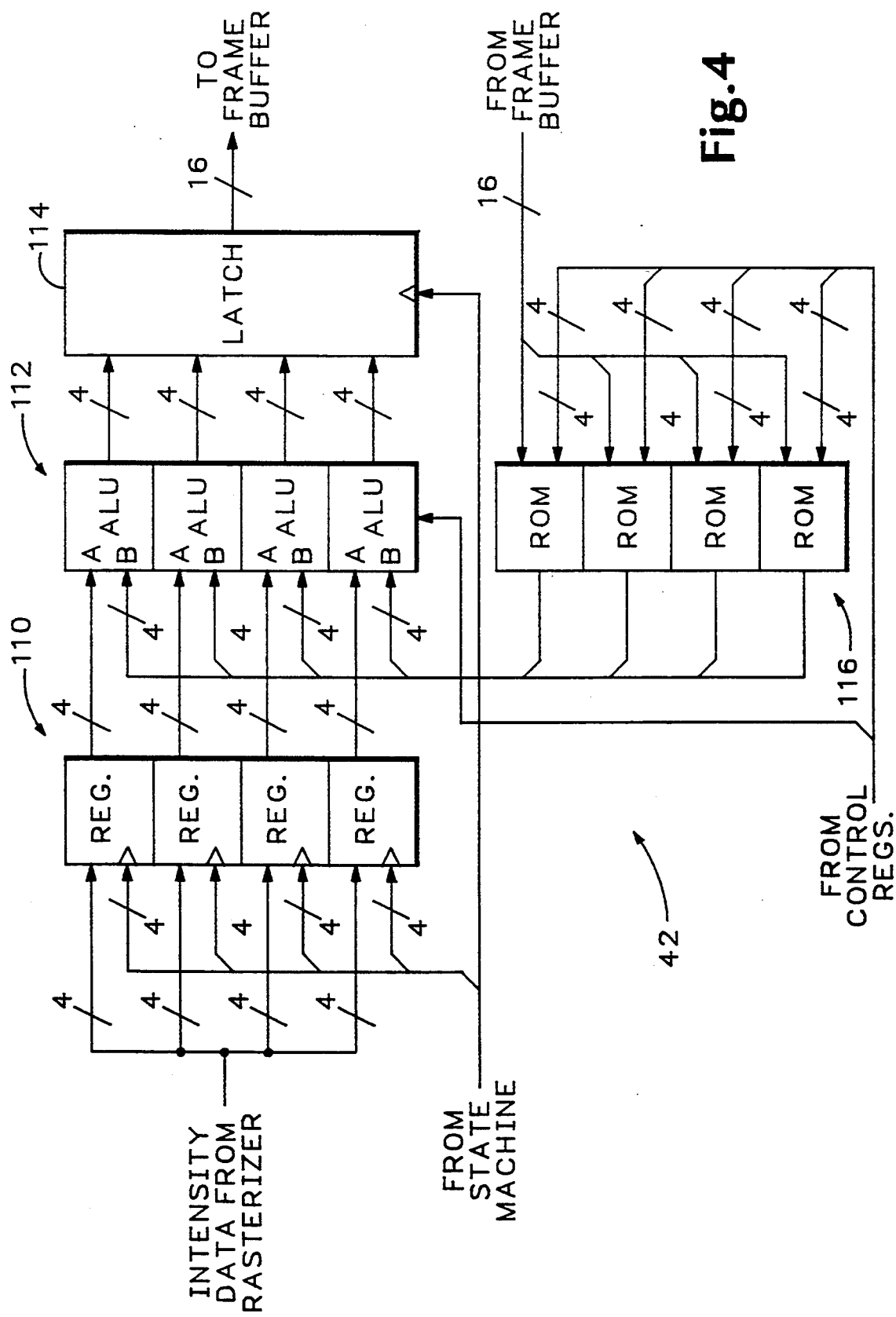

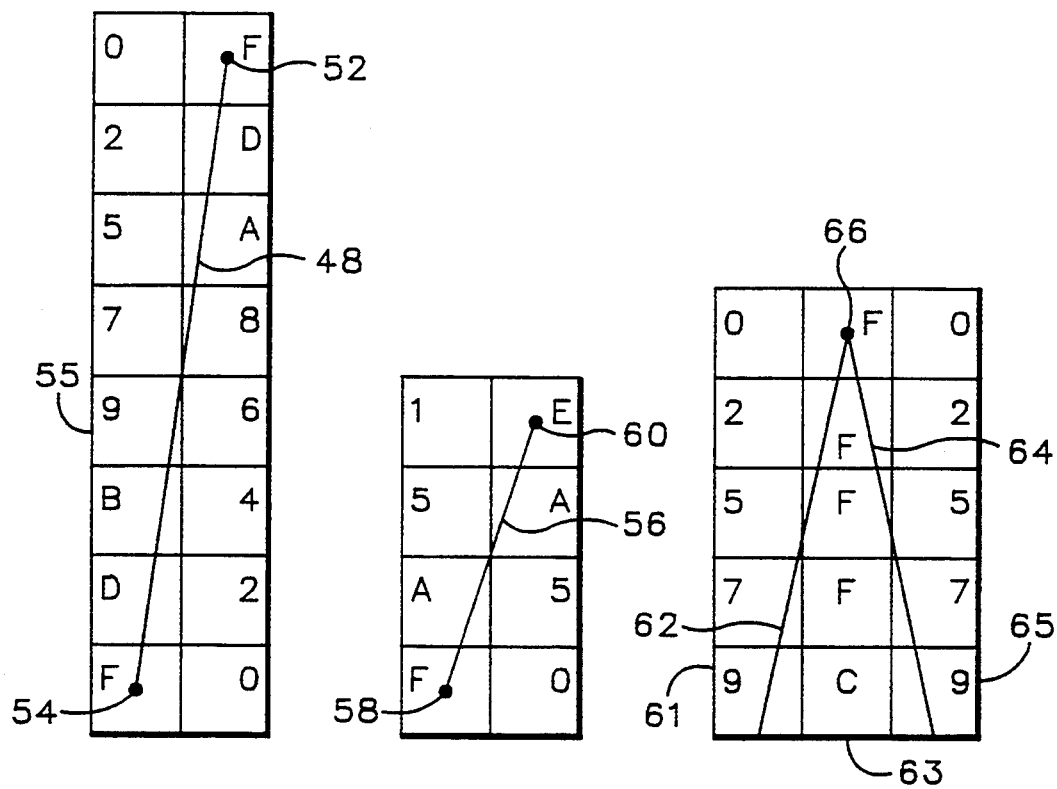
FIG.5A  FIG.5B  FIG.5C
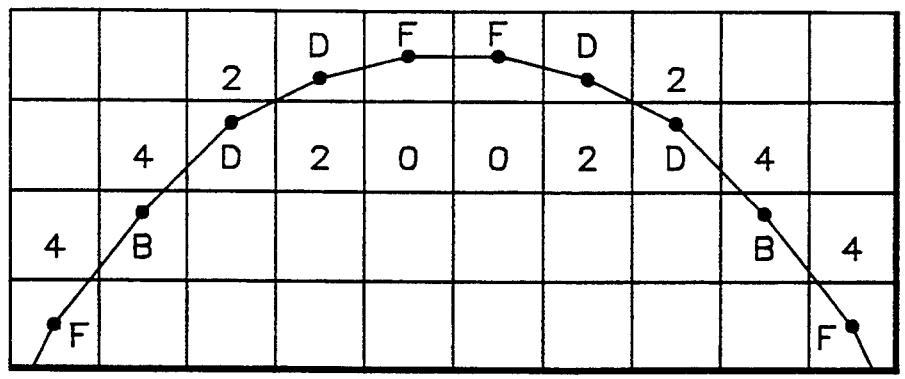
FIG.5D
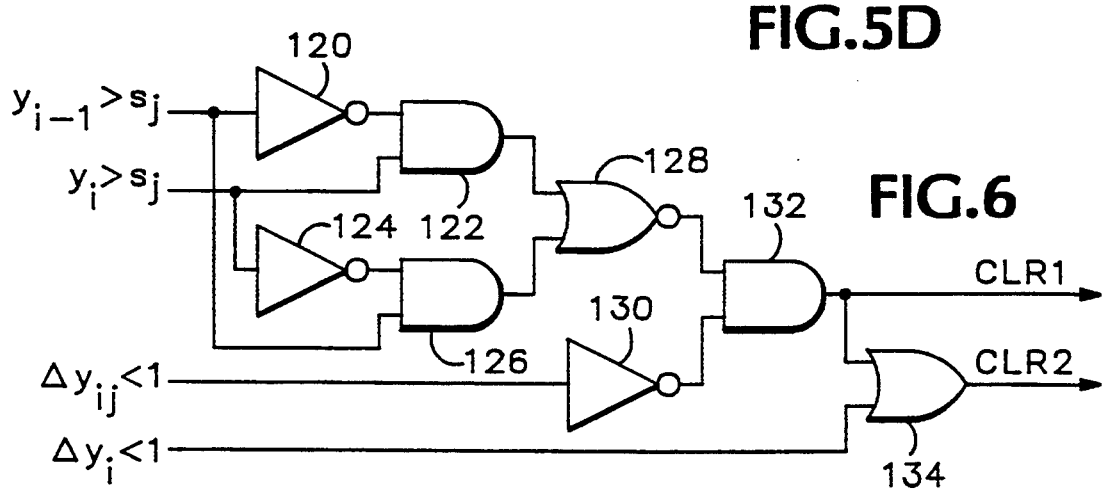
FIG.6

5,440,676

RASTER SCAN WAVEFORM DISPLAY RASTERIZER WITH PIXEL INTENSITY GRADATION

BACKGROUND OF THE INVENTION

The present invention relates in general to raster scan oscilloscopes and in particular to an oscilloscope employing pixel intensity gradation to provide smooth waveform displays.

Digital oscilloscopes typically display waveforms representing magnitudes of input signals as functions of time, the waveforms being formed by selectively illuminating pixels on a cathode ray tube (CRT) screen. Typically, an input signal is sampled and digitized to provide a waveform data sequence, each successive element of the sequence representing the magnitude of the waveform at a successively later time. In a raster scan oscilloscope, displays are formed on a screen by selectively illuminating pixels organized into an array of horizontal rows and vertical columns, each column representing a different time period and each row representing a different magnitude. The waveform data sequence is processed to provide a "bit map", a stored data array indicating whether or not each pixel is to be illuminated. In a horizontal raster scan oscilloscope, an electron beam periodically sweeps horizontally over each pixel row and the beam intensity is modulated during its sweep so that pixels to be included in a waveform are illuminated while pixels not included in a waveform are not illuminated. The determination as to whether each pixel is to be illuminated is made in accordance with the stored bit map.

Since there are a finite number of pixels on the screen, rapidly rising and falling portions of a waveform can appear discontinuous or jagged due to differences in elevation of horizontally contiguous pixels included in the waveform. In addition, due to small amounts of noise introduced by oscilloscope input circuitry, portions of the waveform can appear to oscillate between contiguous pixel rows when the magnitude of the input signal lies between values represented by the elevations of the two pixel rows. This oscillation may give the false impression that the waveform has a high frequency component. In addition, the vertical resolution of the display is limited by the number of rows of pixels on the screen.

SUMMARY OF THE INVENTION

An analog input signal to a digital oscilloscope is sampled and digitized to form a representative waveform data sequence. A waveform is then displayed on a screen of the oscilloscope to represent the magnitude of the waveform as a function of time in accordance with the waveform data sequence. The waveform is formed by a set of vectors, each vector having a straight line trajectory between two points on the screen at elevations representing magnitudes of two successive input signal samples, and at horizontal positions representing timing of the two samples. The screen provides a display organized into an array of pixels, each of which pixels may be illuminated with variable intensity. In accordance with the invention, each vector is represented by illuminating pixels having center points bounding the trajectory of the vector on the screen. Further, the intensity of each such illuminated pixel is modulated in accordance with a distance of its center point from the vector trajectory. By forming vectors in this fashion, apparent discontinuity, jaggedness or oscillation in the waveform is eliminated.

It is accordingly an object of the invention to provide a method and apparatus for displaying a continuous waveform representing the magnitude of a digitized analog input signal as a function of time.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

BRIEF DESCRIPTION OF THE DRAWINGS

FIG. 1 is a block diagram of an oscilloscope implementing present invention;

FIG. 2 is a block diagram of the display system of FIG. 1;

FIG. 4 is a block diagram of the pixel processor circuit of FIG 2;

FIGS. 5A-5D are illustrations of pixel intensity gradation in accordance with the present invention; and FIG. 6 is a schematic diagram of the logic circuit of FIG. 3.

DESCRIPTION OF THE PREFERRED EMBODIMENT

Figure 3:
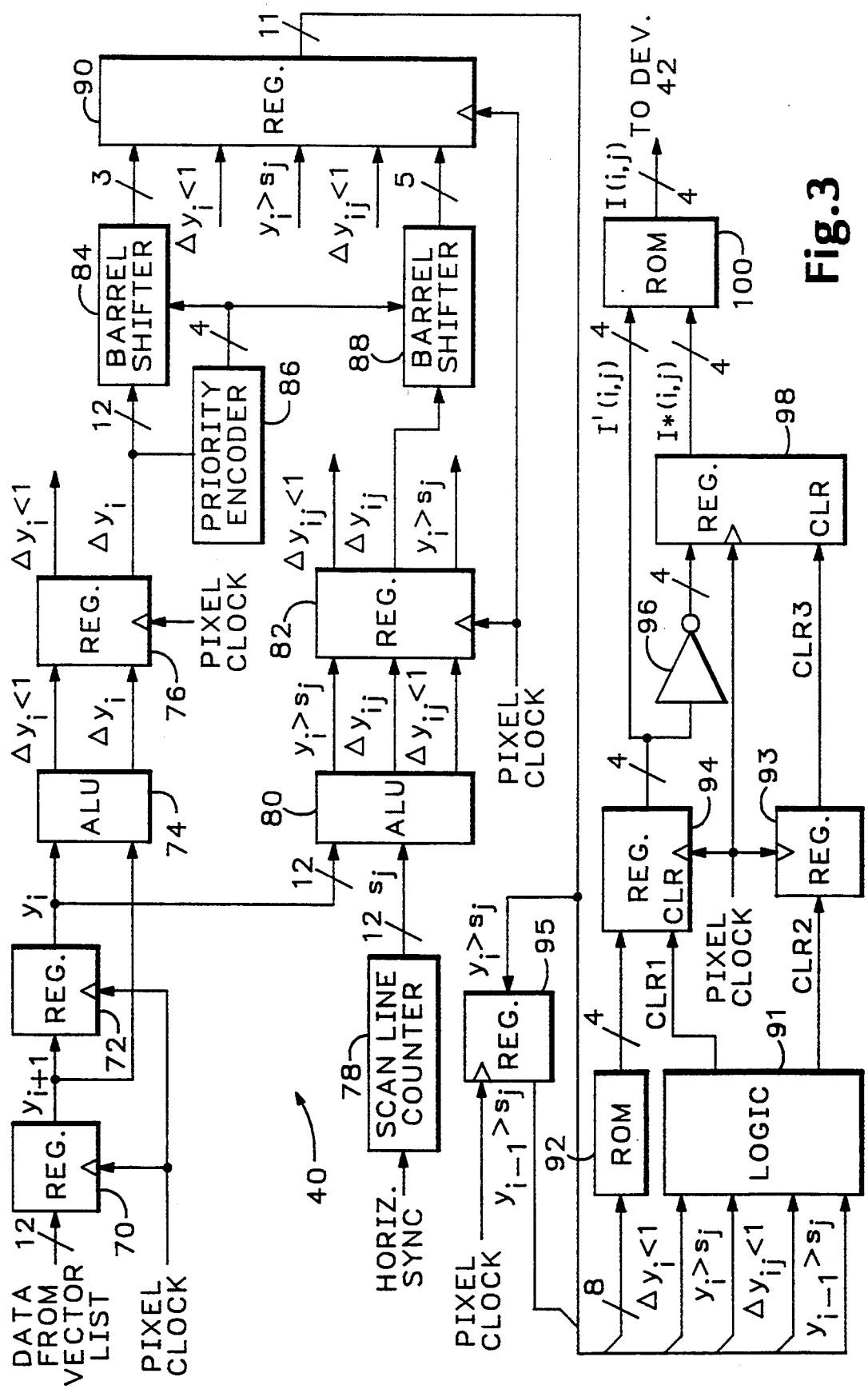
FIG. 3 is a block diagram of the rasterizer circuit of FIG. 2.

FIG. 1 is a block diagram of a raster scan oscilloscope for displaying a waveform representation of an analog input signal in accordance with the present invention. The input signal is applied as input to a vertical preamplifier 10 which adjustably offsets, amplifies and/or attenuates the input signal. The output of the vertical preamplifier provides input to a digitizer 12 for periodically sampling and digitizing its input signal to produce a waveform data sequence (a "vector list") representing the magnitude of the input signal as a function of time. The digitizer 12 sequentially transmits the vector list through a display bus 14 to a random access acquisition memory 16 for storage at sequential addresses therein, memory addressing being provided by the digitizer. Thereafter the vector list may be read out of acquisition memory 16 and transferred via bus 14 to a display system 18 which processes the vector list to produce a waveform display on a cathode ray tube (CRT) screen 20.

A microprocessor 22, operating in accordance with instructions stored in a memory 24, controls operation of vertical preamplifier 10, digitizer 12, and display system 18 using control data transmitted thereto through a system bus 26 which also connects memory 24 to the microprocessor. A user tells the microprocessor 22 how to select gain, offset, sampling rate, trigger level and other operating parameters of the vertical preamplifier 10 and digitizer 12 by operating pushbuttons and/or control knobs or other well-known input devices that cause user interface circuitry 28 to transmit suitable control input data to microprocessor 22. Microprocessor 22 has access to display bus 14 through bus interface circuitry 30, interconnecting the display bus 14 and the system bus 26, and can access acquisition memory 16 to read, modify and/or write vector lists therein. Acquisition memory 16 can store several vector lists defining waveforms representing several previously digitized input signals, and microprocessor 22 selects vector lists to be transferred to the display system in accordance with user input, thereby allowing the user to control which waveforms are displayed on screen 20.

In the preferred embodiment, the oscilloscope of FIG. 1 is a horizontal raster scan oscilloscope wherein screen 20 provides a display organized into an array comprising rows and columns of pixels, each of which pixels may be illuminated with variable intensity, and wherein waveform displays may be produced on the screen by selectively illuminating pixels. Each successive pixel column represents a successive time period, and each row represents a different magnitude. As an electron beam periodically sweeps horizontally over each pixel row, the beam intensity is modulated so that pixels to be included in a waveform are illuminated with variable intensity. The beam is turned off as it scans pixels not included in a waveform so that such pixels are not illuminated. The determination as to whether a pixel is to be illuminated, and the determination as to the intensity of the illumination of each pixel that is to be illuminated, are made in accordance with a bit map created and stored by display system 18 in response to the input vector lists. In the preferred embodiment, the bit map includes 4-bit intensity data values associated with each pixel, and the value of the intensity data indicates the intensity with which the associated pixel is to be illuminated. If the pixel is not to be illuminated, the intensity data has value 0000 (binary). If the pixel is to be illuminated, the 4-bit intensity data indicates one of 15 intensities numbered in order of increasing intensity from 0001 through 1111, and the display system sets the pixel intensity in proportion to the intensity data value.

Display system 18 of FIG. 1, depicted in more detailed block diagram form in FIG. 2, comprises a frame buffer 32, including a memory that stores the bit map, and a display controller 34 that periodically reads the bit map and generates signals controlling the vertical and horizontal movement of the electron beam as well as its intensity. When a vector list is transmitted on bus 14 to the display system 18 from the acquisition memory 16 of FIG. 1, it is stored in a random access memory (RAM) 36. Data lines of display bus 14 are directly connected to data input terminals of RAM 36 while address lines of the display bus are indirectly connected to address terminals of RAM 36 through a multiplexer 38. Waveform magnitude data read out of RAM 36 is provided as input to a rasterizer 40 that produces as output an array of intensity data, each element of the array corresponding to a separate pixel of the pixel array on CRT screen 20 of FIG. 1. The intensity data array output of rasterizer 40 provides input to a pixel processor 42 that may perform various logic operations on the intensity data to selectively adjust its value. The pixel processor 42 then transmits the adjusted intensity data to frame buffer 32 for storage therein as the bit map of the pixel array of screen 20.

Microprocessor 22 of FIG. 1 controls modes of operation of multiplexer 38, rasterizer 40, and pixel processor 42 by placing control data in control registers 44, accessed through the system bus 26, the control data stored in registers 44 providing control inputs to these devices. Read/write operation of RAM 36 and frame buffer 32, and various operations of rasterizer 40 and pixel processor 42, are timed by clock signals produced by a state machine 46 in accordance with control data provided by control registers 44. The clock signals produced by state machine 46 are discussed in more detail hereinbelow. State machine 46 also provides control signals and addresses for reading data out of RAM 36 and for read and write accessing frame buffer 32.

In operation, microprocessor 22 of FIG. 1 transfers a vector list representing a waveform from the acquisition memory 16 to RAM 36 via bus 14, having set a bit in control registers 44 to cause multiplexer 38 to supply RAM 36 with addresses and control signals provided on display bus 14. When the vector list transfer is complete, the microprocessor changes the bit stored in control registers 44 so that multiplexer 38 thereafter supplies addresses produced by state machine 46 to RAM 36, and then initiates operation of state machine 46. Thereafter state machine 46 begins to generate addresses and control signals for RAM 36, causing the vector list to be sequentially read out of RAM 36 and transmitted to rasterizer 40. The vector list includes a data element associated with each column of pixels on the screen, and that data element indicates the input signal magnitude at a time during a time period represented by the associated pixel column. The vector list is read out of RAM 36 and transmitted to rasterizer 40 several times, once for each horizontal row of pixels, and rasterizer 40 uses the vector list to determine an intensity value for each pixel on each row. As it computes an intensity for each pixel, rasterizer 40 transmits data indicating the computed intensity value to pixel processor 42. Pixel processor 42 may then modify the intensity data in accordance with control data provided by control registers 44. Processor 42 then passes the (possibly modified) intensity data to frame buffer 32 for storage at a location within the bit map therein associated with the pixel. State machine 46 provides addresses and control signals to the frame buffer 32 causing it to store each intensity data value at the appropriate location in the bit map within the frame buffer.

As previously mentioned, the display controller 34 periodically reads the bit-mapped intensity data out of frame buffer 32 and produces a waveform display wherein pixels are illuminated with intensities in accordance with the bit map data. A waveform display is formed by a set of vectors, each vector comprising a straight line between two endpoints on the screen at elevations representing magnitudes of two successive input signal samples, and at horizontal positions representing timing of the two samples. In accordance with the invention, each vector is drawn on the screen by illuminating pixels having center points bounding the trajectory of the vector on the screen. Further, the intensity of each such illuminated pixel is modulated in accordance with the horizontal or vertical distance of its center point (i.e., its centroid) from the vector trajectory.

FIGS. 5A–5D graphically depict pixel intensity gradation for four different cases. Each small rectangle in FIGS. 5A–5D represents a separate pixel and each figure shows only a portion of a waveform display, including one or more vectors. Since the intensity data associated with each pixel has four bits, it can represent a range of intensities from 0 though F (hexadecimal) where 0 represents the lowest pixel intensity (i.e., no illumination) and F represents a maximum pixel intensity. In FIG. 5A a single vector 48, extending between endpoints 52 and 54, has a slope greater than unity because it extends vertically the height of seven pixels while extending horizontally only the width of one pixel. The intensity value of each pixel having center points on either side of the vector's nominal trajectory (as represented by the solid line between points 52 and 54) decreases with the horizontal (or vertical) distance of its center point to the vector trajectory. When the vector trajectory passes through or very near the center of a pixel, the pixel is given maximum intensity F. When the horizontal or vertical distance between the center point of a pixel and any vector trajectory is greater than or equal to the horizontal or vertical distance between center points of contiguous pixels, the pixel intensity is set to 0. For pixels having center points intermediate in distance from the vector trajectory, pixel intensity is selected to be roughly in inverse proportion to such distance. Note that in FIG. 5A, the sum of intensities on either side of the vector trajectory is F and that the intensity of each illuminated pixel is equal to the 1's complement of the intensity of its neighbor pixel on the opposite side of the vector trajectory. In waveform display systems of the prior art, pixels closest to the vector endpoints and/or trajectory are maximally illuminated while intermediate pixels are not illuminated. In such case a vector may appear to be discontinuous between its endpoints, particularly if endpoints are vertically spaced relatively far apart. By varying pixel intensity to form a vector as shown in FIG. 5A, the vector appears to have substantially uniform intensity over its trajectory between its endpoints, and apparent discontinuity in the vector is avoided. In addition, the apparent resolution of the display is substantially increased.

FIG. 5B shows a vector 56 between two end-points 58 and 60, vector 56 also having a slope greater than unity but which is not as steep as the slope of vector 48 of FIG. 5A. FIG. 5C shows a waveform peak formed by two vectors 62 and 64 joined at an endpoint 66. In this case center points of some of the pixels bound trajectories of two vectors, and the intensities of these pixels reflect contributions from both vectors. FIG. 5D shows a portion of a waveform display including some vectors having slopes greater than unity and other vectors having slopes less than unity. When a vector slope is greater than unity, intensities of pixels bounding the vector are adjusted in inverse relation to their horizontal distances from the vector trajectory. On the other hand, when a vector slope is less than unity, intensities of pixels having center points bounding the vector trajectory are adjusted in inverse relation to their vertical distances from the vector trajectory.

An intensity value for each pixel is computed by rasterizer 40 of FIG. 2, shown in more detailed block diagram form in FIG. 3. The state machine 46 of FIG. 2 supplies two synchronizing signals to rasterizer 40. One signal is a "pixel clock" signal that is asserted to cause the rasterizer to receive each new vector list data element from the vector list RAM 36 of FIG. 2. The other signal is a "horizontal synchronizing" signal that is asserted to tell the rasterizer that it has just processed the last data element of a vector list. With reference to FIG. 3, each 12-bit data element of the vector list is stored in a register 70 when clocked by the pixel clock signal. On the next pixel clock signal, another register 72 stores the data output of register 70, and register 70 stores the next incoming data element of the vector list. Successive vector list data elements represent successive sample magnitudes ($y_i$) of the input signal, where the index (i) represents the sequence position of the vector list element. With reference for example to FIG. 5A, the magnitude $y_i$ of input signal sample (i) is represented by the elevation of endpoint 54, and the magnitude $y_{i+1}$ of input signal sample (i+1) is represented by the elevation of endpoint 52.

In order to compute the intensity of any pixel along the left column forming vector 48, the values $y_i$ and $y_{i+1}$ are first loaded into registers 72 and 70, respectively. The outputs of registers 70 and 72 are supplied as inputs to an arithmetic logic unit (ALU) 74 that computes the quantity:

$$\Delta y_i = |y_i - y_{i+1}|,$$

which in the example case is the vertical distance between endpoints 52 and 54 of FIG. 5A. This value is stored in a register 76 on the next pixel clock cycle.

ALU 74 also generates a bit indicating whether $\Delta y_i < 1$, and this bit is also stored in register 76. The horizontal synchronizing clock signal produced by the state machine 46 of FIG. 2 is supplied as input to a scan line counter 78 of FIG. 3 which increments its output count on each cycle of the horizontal synchronizing clock signal. The count output of counter 78 represents the vertical elevation ($s_j$) of the pixel at a position (i,j) at column (i) and row (j) of the pixel array, whose intensity I(i,j) is to be computed based on the data currently in registers 70 and 72. Column "i" is the $i^{th}$ column from the leftmost column of the array. Row "j" is the $j^{th}$ row down from the top row of the array.

With reference to FIG. 5A, assume that the intensity of a pixel 55 is to be computed. Then the output of scan line counter 78 of FIG. 3 would indicate the magnitude represented by the elevation of the row of pixels including pixel 55. The output of counter 78 and the output of register 72 provide inputs to another ALU 80 that computes the quantity $\Delta y_{ij} = |y_i - s_j|$, and this quantity is stored in a register 82 on the next pixel clock cycle. With reference to FIG. 5A, the quantity $\Delta y_{ij}$ represents the vertical distance between endpoint 54 and the center point of pixel 55 of FIG. 5A. ALU 80 also generates a bit indicating whether $\Delta y_{ij} < 1$ and a bit indicating whether $y_i > s_j$. These two bits are also stored in register 82.

The output $\Delta y_i$ of register 76 is supplied as input to a barrel shifter 84 and to a priority encoder 86 while the output $\Delta y_{ij}$ of register 82 is supplied as input to another barrel shifter 88. Priority encoder 86 determines the amount by which barrel shifters 84 and 88 shift their inputs based on the value of $\Delta y_i$. Specifically, priority encoder 86 causes barrel shifter 84 to shift its input to the left by the number of bits required to set the most significant bit of its output signal to a logical "1". The priority encoder also causes barrel shifter 88 to shift its input by a similar number of bits. This is done so as to normalize $\Delta y_i$ and $\Delta y_{ij}$ to relatively large values. The three most significant output bits of barrel shifter 84 and the five most significant output bits of barrel shifter 88 are stored in a register 90 on the next pixel clock cycle. The additional output bit $\Delta y_i < 1$ of register 76 indicating whether $\Delta y_i$, the vertical rise of the vector, is less than the distance between the center points, is also stored in register 90. The additional bits $\Delta y_{ij} < 1$ and $y_i > s_j$ stored in register 82 are also supplied as inputs to register 90.

The 8-bit intensity data stored in register 90 addresses a read only memory (ROM) 92 and causes ROM 92 to read out a 4-bit intensity data value which is stored in a register 94 on the next pixel clock cycle. ROM 92 is programmed to choose an appropriate intensity value for the pixel. As previously mentioned, the intensity value of a pixel is determined by the vertical or horizontal distance of the pixel from a vector trajectory depending on whether the slope of the vector trajectory is greater than unity. This vertical or horizontal distance can be determined from the vertical distance $\Delta y_i$ between the endpoints of the vector passing through the pixel column containing the pixel and the distance $\Delta y_{ij}$ between one endpoint of the vector and the pixel row containing the pixel. Such information is included in the output of register 90 which addresses ROM 92, and ROM 92 implements a look-up table which produces the appropriate intensity value as a function of the value of its input address.

With reference, for example to FIG. 5A, the intensity value I'(i,j) for pixel 55 produced by ROM 92 would be 1011 (B hexadecimal). This value is approximately determined by:

$$I'(i,j) = [1 - (\Delta y_{ij} \div \Delta y_i)]F$$

within the 4-bit resolution of the output of ROM 92.

The value I'(i,j) stored in register 94 is applied as input to a set of four inverters 96 which produce as output the one's complement I*(i,j) of I'(i,j) where $$I^*(i,j) = [F - I'(i,j)].$$

The outputs of inverters 96 are stored in a register 98 on the next pixel clock cycle. The 4-bit intensity data values stored in registers 94 and 98 provide address inputs to a ROM 100 which is programmed to read out an intensity data value I(i,j) for each pixel based on its intensity data value inputs. The I'(i,j) input value represents the contribution to pixel intensity from a vector, if any, passing to the right of the center point of the pixel and the input value I*(i,j) representing the contribution to pixel intensity from a vector, if any, passing through or to the left of the center point of the pixel. With reference to FIG. 5C, the intensity value C of a pixel 63 is a function of contributions due to both vectors 62 and 64. The contribution I*(i,j) provided by vector 62 is 6, the one's complement of the intensity value 9 of pixel 61 to the left of pixel 63. Likewise the contribution I'(i,j) provided by vector 64 is the one's complement 6 of the intensity of the pixel 65 to the right of pixel 63. Hence the intensity of pixel 63 is C=6+6. Thus ROM 100 adds its two inputs but its output saturates as F (hexadecimal).

The 66 $y_i<1$, $\Delta y_i$, $\Delta y_{ij}<1$ and $y_i>s_j$ bits stored in register 90 are also supplied as input to logic circuit 91. The $y_i>s_j$ bit is also provided as input to a register 95 clocked by the pixel clock. The bit stored in register 95 (hereinafter referred to as bit $y_{i-1}>s_j$) is also input to logic circuit 91. Logic circuit 91 produces as output two signals CLR1 and CLR2. CLR1 and CLR2 are asserted whenever the vector trajectory does not intersect the pixel array row containing the pixel at position i,j, provided that the distance $\Delta y_{ij}$ between the pixel and an endpoint of the vector is greater than 1. CLR2 is also asserted when the vertical rise $\Delta y_i$ is less than 1. CLR1 clears register 94 so that the intensity data therein is set to zero. CLR2 is also asserted whenever the vector trajectory is not within one pixel unit distance from the pixel at i,j and also when the vector length is less than 1. The CLR2 signal is clocked through a register 93 by the pixel clock and applied as a CLR3 signal to a clear input of register 98.

FIG. 6 is a schematic diagram of logic circuit 91 of FIG. 3. The $y_{i-1}>s_j$ bit is applied as input to an AND gate 126 and also inverted by an inverter 120 and applied as input to another AND gate 122. The $y_i>s_j$ bit provides another input to AND gate 122 and is inverted by an inverter 124 to provide another input to AND gate 126. The outputs of AND gates 122 and 126 are connected to inputs of a NOR gate 128 and the output of NOR gate 128 drives an input of an AND gate 132. The $\Delta y_{ij}<1$ bit is inverted by an inverter 130 and the output of inverter 130 is connected to another input of AND gate 132. The AND gate 132 produces the CLR1 signal. The CLR1 signal and the $\Delta y_i<1$ bit provide inputs to an OR gate 134 that produces the CLR2 signal.

When the vector trajectory does not intersect the pixel array row containing the pixel at position i,j (i.e., when the output of NOR gate 128 is high) and the distance $\Delta y_{ij}$ between the pixel and an endpoint of the vector is greater than 1 (i.e., when the output or inverter 130 is high), CLR1 is driven high by AND gate 132 to clear register 94 of FIG. 3 so that the intensity data output I'(i,j) of ROM 92 does not add to I(i,j). The CLR2 output of OR gate 134 is also driven high so that CLR3 clears register 98 of FIG. 3 one pixel clock cycle later. Thus I*(i,j) does not add to the value of I(i,j) when computed for the pixel at the next position i along row j. When the slope of the vector is less than 1, I*(i,j) should be set to zero. Consequently the $\Delta y_i<1$ drives the CLR2 output of OR gate 134 high so that CLR3 subsequently clears register 98 of FIG. 3.

The 4-bit intensity data produced by rasterizer 40 of FIG. 3 is supplied as input to pixel processor 42 of FIG. 2, shown in more detailed block diagram form in FIG. 4. (Picture processor 42 is disclosed and claimed in co-pending U.S. patent application Ser. No. 07/150,270, entitled "Pixel Intensity Modulation in a Waveform Display" filed Jan. 29, 1988.) With reference to FIG. 4, the 4-bit intensity data from the rasterizer provides input to a set of four registers 110. Frame buffer 32 of FIG. 2 stores bit-mapped pixel data in the form of 16-bit words, each word indicating the intensity of four horizontally contiguous pixels, and the pixel processor collects intensity data associated with four horizontally continuous pixels before performing logical operations on them. Incoming intensity data values associated with the four pixels are collected in the four registers 110. On successive cycles of the pixel clock, intensity data values from the rasterizer are stored in successive ones of registers 110. State machine 46 of FIG. 2 counts and decodes the pixel clock to provide four sequentially asserted control signal inputs to registers 110.

The content of each register 110 is supplied to an A input of a separate one of four arithmetic logic units (ALUs) 112, operations of which are controlled by data from control registers 44 of FIG. 2. The 4-bit output of each ALU 112 provides input to a latch 114 that is clocked by a signal from the state machine every fourth pixel clock cycle. Latch 114 thus latches a 16-bit data word onto its output terminals every fourth pixel clock cycle, and this latched data word provides the pixel data word input to the frame buffer 32 of FIG. 2. The data word is stored in the bit map within the frame buffer at an appropriate address provided by state machine 46 of FIG. 2.

However, prior to storing pixel data at a particular address in the frame buffer, the 16-bit data word currently stored at that address is read out and supplied as input to a set of four ROMs 116. Control data from control registers 44 of FIG. 2 also forms an additional part of the address inputs of ROMs 116. Each ROM 116 is programmed to produce a 4-bit intensity data value output supplied to the B input of a corresponding ALU 112, and the ALUs combine their A and B inputs in a manner determined by their control data inputs to provide their intensity data outputs to latch 114. Depending on the value of control data from the control registers, ROMs 116 may, for example, pass their intensity data value inputs from the frame buffer to the ALUs, may decrement them by a predetermined amount, may set them to 0000, or may output predetermined values regardless of the value of input intensity data from the frame buffer. Also depending on control data supplied by registers 44 of FIG. 2, each ALU may selectively pass only its A input, pass only its B input, add its A and B inputs, OR or XOR (exclusive OR) its A and B inputs, set its output to 1111 or 0000, or perform other logic operations on its A and/or B inputs.

Therefore, in accordance with the manner in which ALUs 112 and ROMs 116 are set to operate, the intensity of a particular pixel on the screen may be a function of its vertical or horizontal distance from one or more vectors included in one or more waveforms, and may also be a function of its last intensity value. The intensity of each pixel can also be driven to 0 to clear the screen or to some predetermined value, regardless of incoming intensity data from the rasterizer, in order to provide a fixed graphic display.

A digital oscilloscope has been described wherein a waveform is formed by a set of vectors, each vector following a straight line trajectory between two endpoints on the screen. The endpoints are at elevations representing magnitudes of two successive input signal samples, and at horizontal positions representing timing of the two samples. The screen provides a display organized into an array of pixels, each of which may be illuminated with variable intensity, and each vector is represented by illuminating pixels having center points bounding the trajectory of the vector on the screen. In particular, the intensity of each such illuminated pixel is modulated in accordance with the horizontal or vertical distance of its center point from the vector trajectory. By forming vectors in this fashion, apparent discontinuity, jaggedness or oscillation in the waveform is eliminated.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A rasterizer for converting vectors in a data list representing sample magnitudes of an input waveform into anti-aliased pixel illumination intensity data to be displayed on a display means comprising:
    (a) means for determining a vertical distance between the endpoints of each of the vectors in the data list;
    (b) means for determining an elevation of a row of pixels that is spanned by the vector;
    (c) means for normalizing the vertical distance and elevation; and
    (d) means for outputting illumination intensity data as a predetermined function of the normalized vertical distance and elevation.

2. A rasterizer as in claim 1 wherein the means for determining the vertical distance between the endpoints of each of the vectors in the data list comprises an arithmetic logic circuit configured to perform an absolute value function.

3. A rasterizer as in claim 1 wherein the means for determining the elevation of a row of pixels that is spanned by the vector comprises an arithmetic logic circuit configured to perform an absolute value function.

4. A rasterizer as in claim 1 wherein the means for normalizing the vertical distance and elevation comprises a pair of barrel shifters.

5. A rasterizer as in claim 1 wherein the means for outputting comprises a read only memory containing the illumination intensity data.

* * * * *